United States Patent [19]
Yoshitake

[11] Patent Number: 6,043,704
[45] Date of Patent: Mar. 28, 2000

[54] CLOCK DISTRIBUTION CIRCUIT FOR SEMICONDUCTOR INTEGRATED CIRCUIT

[75] Inventor: Akihiro Yoshitake, Kawasaki, Japan

[73] Assignee: Fujitsi Limited, Kawasaki, Japan

[21] Appl. No.: 09/110,683

[22] Filed: Jul. 7, 1998

[30] Foreign Application Priority Data

Dec. 12, 1997 [JP] Japan .................................. 9-342785

[51] Int. Cl.[7] .............................................. H01L 25/00
[52] U.S. Cl. ........................................ 327/565; 327/295
[58] Field of Search ................................. 327/295, 565, 327/297, 291, 292, 293, 294; 326/101, 47; 375/356

[56] References Cited

U.S. PATENT DOCUMENTS

| | | | |
|---|---|---|---|
| 5,140,184 | 8/1992 | Hamamoto et al. | 327/565 |
| 5,172,330 | 12/1992 | Watanabe et al. | 364/491 |
| 5,239,215 | 8/1993 | Yamaguchi | 327/292 |
| 5,430,397 | 7/1995 | Itoh et al. | 326/101 |
| 5,668,484 | 9/1997 | Nomura | 326/93 |

FOREIGN PATENT DOCUMENTS

4-93061  3/1992  Japan .
4-373160 12/1992  Japan .

*Primary Examiner*—Timothy P. Callahan
*Assistant Examiner*—Anh-Quan Tra
*Attorney, Agent, or Firm*—Armstrong, Westerman, Hattori, McLeland & Naughton

[57] ABSTRACT

The invention provides a clock distribution circuit which can be applied readily also to a chip (semiconductor integrated circuit) of the building block type and can realize reduction in skew. The clock distribution circuit includes a first buffer disposed at a central location of the chip for receiving an output of an input driver, four second buffers individually disposed at central locations of four sides of the chip for receiving an output of the first buffer, a plurality of third buffers for receiving outputs of the second buffers, and a last stage connection wiring line system for connecting all of outputs of the third buffers commonly to extract a clock signal to be supplied to clock terminals. The third buffers are disposed on linear lines parallel to the two upper and lower sides of the chip, and the outputs of the third buffers are connected to each other by linear wiring lines. The clock distribution circuit further includes a load adjustment structure for adjusting a load to the first buffer or/and each of the second buffers. The present invention can be applied to a chip of the building block type which includes a RAM or a large number of huge macro blocks and the like.

23 Claims, 3 Drawing Sheets

CLOCK DISTRIBUTION CIRCUIT FOR SEMICONDUCTOR INTEGRATED CIRCUIT

BACKGROUND OF THE INVENTION

1) Field of the Invention

This invention relates to a clock distribution circuit for a semiconductor integrated circuit such as an LSI wherein a large number of cells are arranged on a chip of a rectangular shape including a square shape for distributing a clock signal to those cells each of which has a clock terminal, and more particularly to a clock distribution circuit suitable for use with a chip of the building block type which includes a RAM and/or a large number of huge macro blocks.

2) Description of the Related Art

Generally, a semiconductor integrated circuit such as, for example, an LSI entirely operates in synchronism with a single clock signal or a plurality of clock signals having different phases from each other. In such an instance, a clock signal or signals supplied from the outside are distributed to flip-flops (cells each having a clock terminal) of various circuits in the LSI to allow such operations as decoding, reading/writing of memories and calculation. However, where the wiring line lengths from the distribution source or sources of the clock signal or signals to the distribution destinations are different from each other, some displacements (clock skews) appear among arriving timings of the clock signal or signals. If a clock skew appears, then a flip-flop may fetch a wrong signal or a logic gate may generate an undesirable hair-shaped pulse at an output thereof, resulting in malfunction of a circuit. Accordingly, the magnitude of a clock skew makes a factor which determines the performance (operation speed) of the LSI.

Figure 4:
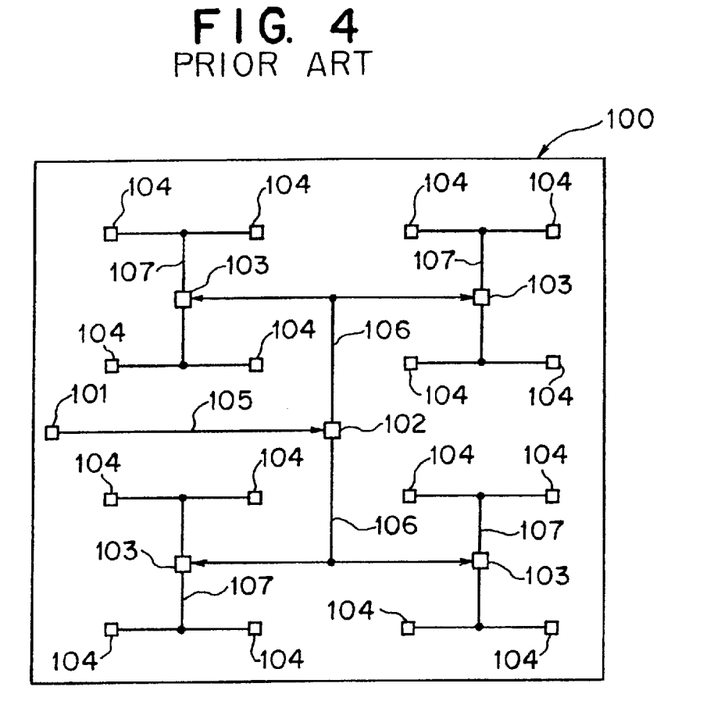
FIG. 4 is a diagrammatic view showing a semiconductor integrated circuit (chip) to which an H-shaped clock distribution system is applied.

Therefore, such an H-shaped clock distribution system as shown in FIG. 4 is usually employed in a semiconductor integrated circuit such as an LSI. Referring to FIG. 4, the H-shaped clock distribution system shown includes a plurality of stages (three stages in FIG. 4) of buffers 102 to 104 provided on a rectangular (square) chip 100. The buffers 102 to 104 are connected to each other in a tree-like configuration by H-shaped clock wiring lines 106 and 107.

More particularly, an input driver 101 for receiving a clock signal from the outside is provided at the center of one side (left side in FIG. 4) of a peripheral region of the chip 100. An output of the input driver 101 is inputted to the first buffer 102 disposed at the center of the chip 100 by a clock wiring line 105.

An output of the first buffer 102 is inputted to the four second buffers 103 by the H-shaped clock wiring line 106 which is centered at the first buffer 102. The second buffers 103 are individually disposed at four terminal ends of the H-shaped clock wiring line 106. Consequently, the wiring line lengths from the first buffer 102 to the four second buffers 103 are equal to each other.

Each of outputs of the second buffers 103 is inputted to four ones of the third buffers 104 by one of the H-shaped clock wiring lines 107 which is centered at the second buffer 103. The third buffers 104 are disposed at four terminal ends of the H-shaped clock wiring line 107, and consequently, the wiring line lengths from the second buffer 103 to the four third buffers 104 are equal to each other.

Since the buffers 102 to 104 are connected in such a manner as described above by the clock wiring lines 106 and 107, a clock signal is distributed to the 16 third buffers 104 disposed substantially in a uniform density in a cell arrangement region of the chip 100 and is then supplied from the third buffers 104 to the clock terminals of flip-flops or like elements. In this instance, the wiring line lengths from the first buffer 102 to the third buffers 104 are all equal to each other, and consequently, clock skews at the buffers 104 in the last stage can be made uniform. It is to be noted that the third buffers 104 may be connected to further buffers by H-shaped clock wiring lines to further distribute the clock signal to the further buffers.

Figure 5:
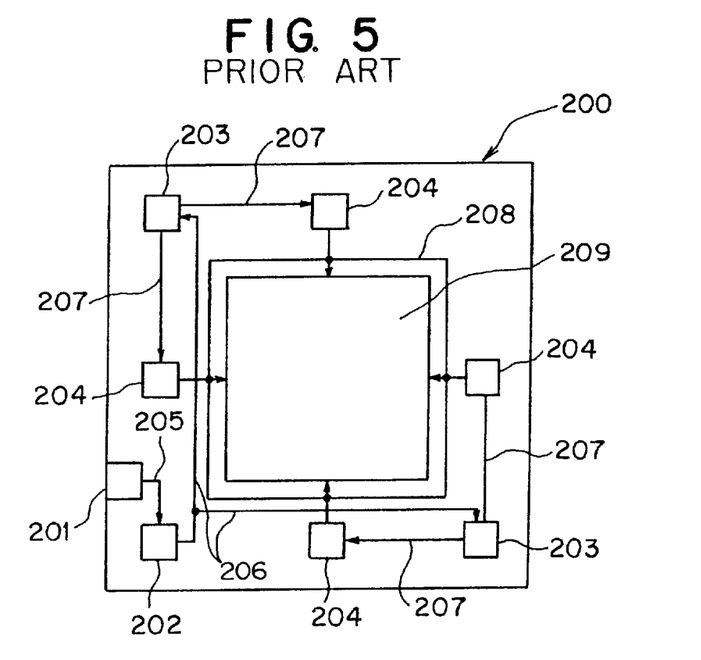
FIG. 5 is a diagrammatic view showing another semiconductor integrated circuit (chip) to which another clock distribution system is applied.

Another clock distribution system is disclosed, for example, in Japanese Patent Laid-Open Application No. Heisei 4-373160, and is shown in FIG. 5. Referring to FIG. 5, the clock distribution system shown includes a plurality of stages (three stages in FIG. 5) of buffers 202 to 204 provided on a square chip 200. The buffers 202 to 204 are connected to each other in a tree-like configuration by clock wiring lines 206 and 207, and outputs of the four third buffers 204 are all connected commonly to a wiring line 208.

More particularly, an input driver 201 for receiving a clock signal from the outside is provided on one side (left side in FIG. 5) of a peripheral region of the chip 200. An output of the input driver 201 is inputted to the first buffer 202 disposed at one corner portion (left lower corner portion in FIG. 5) of the peripheral region of the chip 200 by a clock wiring line 205.

An output of the first buffer 202 is inputted to the two second buffers 203 disposed at a left upper corner portion and a right lower corner portion of the peripheral region of the chip 200 over the clock wiring lines 206. Here, the wiring line lengths from the first buffer 202 to the second buffers 203 are equal to each other.

An output of the second buffer 203 located at the left upper corner portion is inputted to the two third buffers 204 arranged at the center of the upper side and the center of the left side of the peripheral region of the chip 200 over the clock wiring lines 207. Meanwhile, an output of the second buffer 203 located at the right lower corner portion is inputted to the two third buffers 204 disposed at the center of the lower side and the center of the right side of the peripheral region of the chip 200 over the clock wiring lines 207. Also here, the wiring line lengths from the second buffers 203 to the third buffers 204 are all equal to each other.

Further, outputs of the four third buffers 204 are all connected commonly by the wiring line 208 which is formed in such a manner as to surround a cell arrangement area 209 on the chip 200. A clock signal to be supplied to clock terminals in the cell arrangement area 209 is extracted from the wiring line 208.

In the clock distribution system described above with reference to FIG. 5, since the wiring line lengths from the first buffer 202 to the third buffers 204 are equal to each other and the outputs of the third buffers 204 in the last stage are connected commonly by the wiring line 208 to extract a single output, clock skews at the third buffers 204 in the last stage can be made uniform and also the driving capacity of the entire circuitry can be raised.

By the way, in recent years, an increase in clock frequency has proceeded, and, for example, for a chip which operates with a clock signal of a frequency of several hundreds MHz, it is demanded to suppress the clock skew to the level of several tens picoseconds. In order to satisfy the demand for such a low skew using such an H-shaped clock distribution system as shown in FIG. 4, the clock wiring lines must be wired in substantially a perfect H-shaped configurations and the buffers in the last stage (third buffers 104 in FIG. 4) must be arranged in a uniform density in the cell arrangement area of the chip.

Further, an increase in density and scale of a semiconductor integrated circuit such as an LSI has proceeded to such a degree that a chip sometimes includes up to one million gates. In such an instance, it is difficult for a designer to handle all of such gates uniformly, elements on the chip are blocked to effect hierarchical designing. In particular, different macro blocks whose are different in size and/or shape from each other are first designed individually, and then the macro blocks and macro elements which originally have large sizes such as a RAM are mapped on the chip to design a semiconductor integrated circuit. It is to be noted that such a design type as just described is called building block type.

However, in a chip of the building block type, since it includes a large number of blocks (for example, a RAM, huge macro blocks and so forth) having different sizes, such a situation that, for example, a macro block is present in a region in which an H-shaped clock distributing buffer should be arranged is likely to occur, and it is difficult to lay clock wiring lines of a completely H-shaped configuration. Then, where the H-shaped clock distribution method is applied, the balance of the clock distribution system (uniformity in wiring line length) is lost at all, and a large clock skew is produced. Where blocks of various sizes are arranged on a chip, it makes a significant restriction to designing of the chip to arrange buffers in the last stage in a uniform density and simultaneously make the lengths of all clock wiring lines to individual clock terminals uniform.

Meanwhile, with the clock distribution system shown in FIG. 5, while it is possible to make clock skews at the output terminals of the third buffers 204 uniform, no countermeasure is taken against skews which are produced by distributing a clock signal from the output terminals of the third buffers 204 to clock terminals of flip-flops or like circuit elements in the cell arrangement area 209, and skews appear at the clock terminals of such flip-flops or macro blocks arranged in the cell arrangement area 209. In order to prevent production of clock skews with certainty, buffers must be arranged in a density as uniform as possible also in the inside of the chip (in the actual cell arrangement area 209) and the lengths of clock wiring lines to the clock terminals of the buffers must be made uniform. However, Japanese Patent Laid-Open Application No. Heisei 4-373160 is quite silent of such design.

SUMMARY OF THE INVENTION

It is an object of the present invention to provide a clock distribution circuit for a semiconductor integrated circuit which can be applied readily also to a chip (semiconductor integrated circuit) of the building block type which includes a RAM or a large number of other huge macro blocks and can realize reduction in skew.

In order to attain the object described above, according to an aspect of the present invention, there is provided a clock distribution circuit for a semiconductor integrated circuit wherein a large number of cells are disposed on a rectangular chip having four sides including two first parallel sides and two second parallel sides perpendicular to the first parallel sides for distributing a clock signal to those of the cells each of which has a clock terminal, comprising an input driver for receiving an external clock signal, a first buffer disposed at a central location of the chip for receiving an output of the input driver, four second buffers individually disposed at central locations of the four sides in a peripheral area of the chip for receiving an output of the first buffer, a plurality of third buffers for receiving outputs of the second buffers, a last stage connection wiring line system for connecting all of outputs of the third buffers commonly to extract a clock signal to be supplied to the clock terminals, the third buffers being disposed on linear lines parallel to the first sides of the chip while the outputs of the third buffers are connected to each other by linear wiring lines which form part of the last stage connection wiring line system and extend along the linear lines, and a load adjustment structure for adjusting a load to the first buffer or/and each of the second buffers. The chip may be partitioned into a plurality of belt-like regions which extend in parallel to the first sides and in which the third buffers are individually disposed on the linear lines parallel to the first sides.

According to another aspect of the present invention, there is provided a clock distribution circuit for a semiconductor integrated circuit wherein a large number of cells are disposed on a rectangular chip having four sides including two first parallel sides and two second parallel sides perpendicular to the first parallel sides for distributing a clock signal to those of the cells each of which has a clock terminal, comprising an input driver for receiving an external clock signal, a first buffer disposed at a central location of the chip for receiving an output of the input driver, four second buffers individually disposed at central locations of the four sides in a peripheral area of the chip for receiving an output of the first buffer, a plurality of third buffers for receiving outputs of the second buffers, and a last stage connection wiring line system for connecting all of outputs of the third buffers commonly to extract a clock signal to be supplied to the clock terminals, and wherein the chip is partitioned into a plurality of belt-like regions which extend in parallel to the first sides and in each of which the third buffers are disposed on a linear line parallel to the first sides of the chip while the outputs of the third buffers are connected to each other by a linear wiring line which forms part of the last stage connection wiring line system and extends along the linear lines.

The clock distribution circuit for a semiconductor integrated circuit may further comprise a load adjustment structure for adjusting a load to the first buffer or/and each of the second buffers. The last stage connection wiring line system may be formed by connecting a clock terminal connection wiring line, which is formed in a wiring line layer different from a wiring line layer to which the linear wiring lines belong such that the clock terminal connection wiring line connects all clock terminals in the chip to each other, and the linear wiring lines to each other at intersecting points therebetween.

The clock distribution circuit for a semiconductor integrated circuit may be constructed such that the third buffers are disposed in the belt-like regions such that one of the third buffers is disposed on each of the second sides in the peripheral area of the chip and a plurality of ones of the third buffers are disposed in an internal region of the chip, that those of the second buffers which are arranged at the central locations of the second sides are connected to those of the third buffers which are disposed individually on the second sides, and that those of the second buffers which are disposed at the central locations of the first sides are connected to those of the third buffers which are disposed in those halves of the internal region adjacent the first sides of the chip.

The load adjustment structure may include at least one dummy gate for load adjustment provided for a clock wiring line on an output side of each of the second buffers or may include at least one dummy gate for load adjustment provided for a clock wiring line on an output side of each of the third buffers.

The clock distribution circuit for a semiconductor integrated circuit may be constructed such that, in a wiring line layer of clock wiring lines which interconnect the first buffer and the second buffers, a pair of shield wiring lines are formed on the opposite sides of each of the clock wiring lines, and the load adjustment structure may be formed by forming such shield wiring lines and forming each of the clock wiring lines in a tapering configuration. Similarly, the clock distribution circuit for a semiconductor integrated circuit may be constructed such that, in a wiring line layer of clock wiring lines which interconnect the second buffers and the third buffers, a pair of shield wiring lines are formed on the opposite sides of each of the clock wiring lines, and the load adjustment structure may be formed by forming such shield wiring lines and forming each of the clock wiring lines in a tapering configuration.

In any of the clock distribution circuits individually having the constructions described above, a clock signal is supplied from the first buffer disposed at the central location of the chip to the second buffers disposed at the central locations of the four sides in the peripheral region of the chip over clock wiring lines. In this instance, since a macro block or a like element is not disposed in the peripheral area of the chip at all, the second buffers are disposed the central locations of the sides without any problem.

Accordingly, if the first buffer can be disposed at the central location of the chip, then the lengths of the clock wiring lines from the first buffer to the second buffers become uniform, and consequently, the clock skews at the four second buffers can be made uniform. Further, even if the first buffer cannot be disposed at the central location of the chip but is disposed at a location somewhat displaced from the central location, clock delays which arise from such dislocation of the first buffer from the central location of the chip are absorbed by the last stage connection wiring line system or by the loads to the buffers adjusted using the load adjustment structures, and consequently, the clock skews can be made uniform.

Further, since the third buffers are arranged on the linear lines and the outputs of them are connected to each other by the linear wiring lines, the clock distribution circuit can cope with any arrangement condition of macro blocks on the chip by translationally moving the locations of those buffers which are disposed in the internal region of the chip along the linear wiring lines. Clock delays which arise from the translational movements are absorbed by the last stage connection wiring line system or by the loads to the buffers adjusted using the load adjustment structures, and consequently, the clock skews can be made uniform.

Further, where, to those third buffers located on the sides, the second buffers on the same sides are connected while, to the third buffers in the internal region of the chip, those second buffers which are disposed on the sides nearest to the third buffers in the internal region are connected, the lengths of the clock wiring lines from the second buffers to the third buffers are substantially uniform, and consequently, the clock skews at the third buffers can be made uniform.

Further, the clock delays (clock skews) can be adjusted by connecting dummy gates to the clock wiring lines on the output sides of the second buffers or the third buffers or disconnecting such dummy gates from the wiring lines to adjust the loads to the second buffers or the third buffers.

Furthermore, where a pair of shield wiring lines are formed on the opposite sides of each of the clock wiring lines, the wiring line capacitance of each of the clock wiring lines can be prevented from being varied by an influence of the other signal lines, and the designer can always grasp the capacitance of each clock wiring line. In this instance, the clock delays (clock skews) can be adjusted by forming each of the clock wiring lines in a tapering configuration to adjust the capacitance which is produced between the clock wiring line and the corresponding shield wiring lines.

In this manner, with the clock distribution circuits for an integrated circuit according to the present invention described above, those third buffers which are disposed in the internal region of the chip have a high degree of freedom in arrangement and the arrangement positions of the third buffers can be displaced suitably, and clock delays which arise from such displacement can be adjusted by the final stage connection wiring line system or by the loads to the buffers adjusted using the load adjustment structures.

Accordingly, in designing a chip of the building block type which includes a RAM or a large number of other huge macro blocks, the designer is not annoyed by the problem of insertion of buffers which arises from the arrangement positions of the blocks on the chip. Further, a countermeasure can be taken against a requirement for modification in shape or movement of the blocks which arises during designing, and a buffer arrangement which exhibits low skews can be realized readily.

Further, since the lengths of the clock wiring lines from the second buffers to the third buffers can be made substantially uniform, the clock skews at the third buffers can be made uniform with a higher degree of certainty.

Further, the clock delays can be adjusted positively by adjusting the loads to the second buffers or the third buffers using dummy gates, and consequently, the clock skews can be made uniform with a higher degree of certainty and a buffer arrangement which exhibits low skews can be realized very readily.

Furthermore, where a pair of shield wiring lines are formed on the opposite sides of each of the clock wiring lines, the wiring line capacitance of each of the clock wiring lines can be prevented from being varied by an influence of the other signal lines, and the designer can always grasp the capacitance of each clock wiring line and can effect calculation taking the capacitance into consideration in an initial stage of designing, and consequently, the clock skews can be made uniform with a higher degree of certainty. In this instance, the clock delays can be adjusted positively by forming each of the clock wiring lines in a tapering configuration to adjust the wiring line capacitance, and consequently, the clock skews can be made uniform with a higher degree of certainty and a buffer arrangement which exhibits low skews can be realized very readily.

The above and other objects, features and advantages of the present invention will become apparent from the following description and the appended claims, taken in conjunction with the accompanying drawings in which like parts or elements denoted by like reference symbols.

DESCRIPTION OF THE PREFERRED EMBODIMENT

Figure 1:
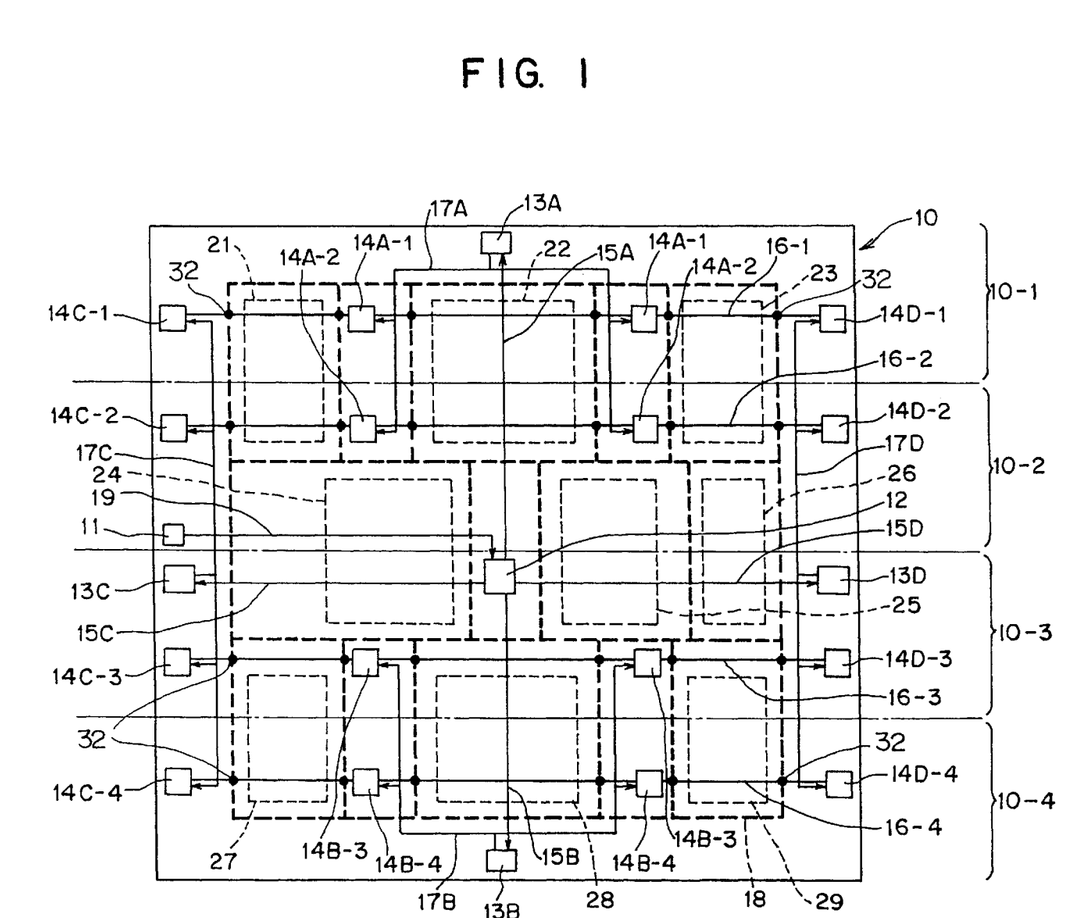
FIG. 1 is a diagrammatic view of a semiconductor integrated circuit (chip) which includes a clock distribution circuit to which the present invention is applied.

Referring first to FIG. 1 there is shown a semiconductor integrated circuit which includes a clock distribution circuit to which the present invention is applied. The semiconductor integrated circuit or chip 10 has a square shape and has provided thereon an input driver 11 for receiving a clock signal from the outside, a first buffer 12 for receiving an output of the input driver 11, four second buffers 13A, 13B, 13C and 13D for receiving an output of the first buffer 12, 16 third buffers 14A-1, 14A-2, 14B-3, 14B-4, 14C-1 to 14C-4 and 14D-1 to 14D-4 for receiving outputs of the second buffers 13A to 13D.

The input driver 11 is disposed on one side (left side in FIG. 1) in a peripheral region of the chip 10. The input driver 11 is connected to the first buffer 12 by a clock wiring line 19 so that an output of the input driver 11 is inputted to the first buffer 12 over the clock wiring line 19.

The first buffer 12 is disposed at a central location of the chip 10. The first buffer 12 is connected to the second buffers 13A, 13B, 13C and 13D by four clock wiring lines 15A, 15B, 15C and 15D, respectively, so that an output of the first buffer 12 is inputted to the second buffers 13A to 13D over the clock wiring lines 15A to 15D, respectively.

The second buffers 13A 13B, 13C and 13D are disposed at central portions of the four sides (upper, lower, left and right sides of FIG. 1) of the peripheral area of the chip 10.

Further, in the present embodiment, as seen from FIG. 1, the chip 10 is divided into four belt-like regions 10-1 to 10-4 extending in parallel to the two upper and lower sides (one of two side sets each including two parallel sides) of the chip 10, and four third buffers are disposed in each of the belt-like regions 10-1 to 10-4 as hereinafter described.

In the belt-like region 10-1, the third buffers 14C-1 and 14D-1 are disposed on the two left and right sides (the other side set) of the peripheral area of the chip 10, and the two third buffers 14A-1 are disposed in the internal area of the chip 10. The four third buffers 14C-1, 14D-1 and 14A-1 are disposed such that they are juxtaposed on a linear line parallel to the two upper and lower sides, and outputs of the four third buffers 14C-1, 14D-1 and 14A-1 are connected to each other by a linear wiring line 16-1 extending along the linear line.

Similarly, in the belt-like region 10-2, the third buffers 14C-2 and 14D-2 are disposed on the two left and right sides (the other side set) of the peripheral area of the chip 10, and the two third buffers 14A-2 are disposed in the internal area of the chip 10. The four third buffers 14C-2, 14D-2 and 14A-2 are disposed such that they are juxtaposed on a linear line parallel to the two upper and lower sides, and outputs of the four third buffers 14C-2, 14D-2 and 14A-2 are connected to each other by a linear wiring line 16-2 extending along the linear line.

In the belt-like region 10-3, the third buffers 14C-3 and 14D-3 are disposed on the two left and right sides (the other side set) of the peripheral area of the chip 10, and the two third buffers 14B-3 are disposed in the internal area of the chip 10. The four third buffers 14C-3, 14D-3 and 14B-3 are disposed such that they are juxtaposed on a linear line parallel to the two upper and lower sides, and outputs of the four third buffers 14C-3, 14D-3 and 14B-3 are connected to each other by a linear wiring line 16-3 extending along the linear line.

In the belt-like region 10-4, the third buffers 14C-4 and 14D-4 are disposed on the two left and right sides (the other side set) of the peripheral area of the chip 10, and the two third buffers 14B-4 are disposed in the internal area of the chip 10. The four third buffers 14C-4, 14D-4 and 14B-4 are disposed such that they are juxtaposed on a linear line parallel to the two upper and lower sides, and outputs of the four third buffers 14C-4, 14D-4 and 14B-4 are connected to each other by a linear wiring line 16-4 extending along the linear line.

The second buffer 13C disposed at the central portion of the left side is connected to the four third buffers 14C-1 to 14C-4 disposed on the left side by a clock wiring line 17C so that an output of the second buffer 13C is inputted to the third buffers 14C-1 to 14C-4 over the clock wiring line 17C.

Similarly, the second buffer 13D disposed at the central portion of the right side is connected to the four third buffers 14D-1 to 14D-4 disposed on the right side by a clock wiring line 17D so that an output of the second buffer 13D is inputted to the third buffers 14D-1 to 14D-4 over the clock wiring line 17D.

Further, the second buffer 13A disposed at the central portion of the upper side is connected to the four third buffers 14A-1 and 14A-2 disposed in the upper side half portion of the internal area of the chip 10 by a clock wiring line 17A so that an output of the second buffer 13A is inputted to the third buffers 14A-1 and 14A-2 over the clock wiring line 17A.

Similarly, the second buffer 13B disposed at the central portion of the lower side is connected to the four third buffers 14B-3 and 14B-4 disposed in the lower side half portion of the internal area of the chip 10 by a clock wiring line 17B so that an output of the second buffer 13B is inputted to the third buffers 14B-3 and 14B-4 over the clock wiring line 17B.

Further, outputs of the 16 third buffers 14A-1, 14A-2, 14B-3, 14B-4, 14C-1 to 14C-4 and 14D-1 to 14D-4 are all connected to each other by a last stage connection wiring line system which includes the linear wiring lines 16-1 to 16-4 described above and a clock terminal connection wiring line 18 which will be hereinafter described so that a clock signal to be supplied to clock terminals may be extracted from the last stage connection wiring line system.

In short, in the present embodiment, the clock terminal connection wiring line 18 connects all clock terminals in the chip 10 in a wiring line layer (lower layer, macro arrangement layer) different from the wiring line layer which is formed from buffers of three stages and various wiring lines and forms the clock distribution circuit as described hereinabove.

In the lower layer, for example, nine macro blocks 21 to 29 (including RAMs) are disposed, and the clock terminal connection wiring line 18 which connects all of the clock terminals (not shown) of the macro blocks 21 to 29 is formed in a rectangular configuration such that it surrounds the outer peripheries of the macro blocks 21 to 29 as indicated by thick broken lines in FIG. 1.

Further, the linear wiring lines 16-1 to 16-4 and the clock terminal connection wiring line 18 are connected to each other at intersecting points 32 between the linear wiring lines 16-1 to 16-4 which extend in the leftward and rightward directions in the upper layer and portions of the clock terminal connection wiring line 18 in the lower layer which extend in the upward and downward directions to form the last stage connection wiring line system described above.

The clock terminal connection wiring line 18 and the clock terminals of the macro blocks 21 to 29 are connected to each other by clock wiring lines not shown so that a clock signal extracted from the clock terminal connection wiring line 18 may finally be inputted to the clock terminals of the macro blocks 21 to 29.

Figure 2:
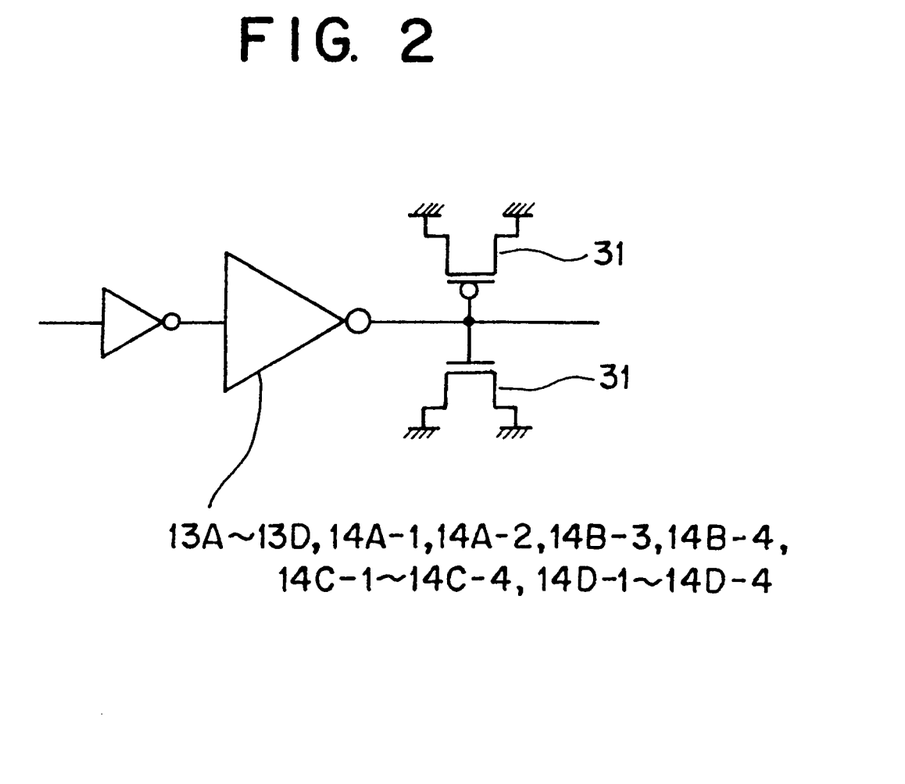
FIG. 2 is a circuit diagram showing a dummy gate for load adjustment employed in the clock distribution circuit shown in FIG. 1.

Meanwhile, though not shown in FIG. 1, in the clock distribution circuit of the present embodiment, as shown in FIG. 2, a clock wiring line on the output side of each of the second buffers 13A to 13D and the third buffers 14A-1, 14A-2, 14B-3, 14B-4, 14C-1 to 14C-4 and 14D-1 to 14D-4 has at least one (two in FIG. 2) dummy load (dummy gate) 31 for load adjustment provided therefor.

For each dummy load 31, for example, a field effect transistor (FET) is used. A suitable number of such dummy loads 31 are formed for each clock wiring line in the chip 10 in advance.

Thus, the loads to the second buffers 13A to 13D or the third buffers 14A-1, 14A-2, 14B-3, 14B-4, 14C-1 to 14C-4 and 14D-1 to 14D-4 are adjusted by connecting the dummy loads 31 to the clock wiring lines or disconnecting a suitable number of dummy loads 31 from the clock wiring lines. In short, the clock delays can be controlled by the metal wiring patterns between the dummy loads 31 and the clock wiring lines.

Further, though not shown in FIG. 1, in the clock distribution circuit of the present embodiment, a pair of shield wiring lines 20 are formed on the opposite sides of each of the clock wiring lines 15A to 15D which interconnect the first buffer 12 and the second buffers 13A to 13D, respectively. Each of the clock wiring lines 15A to 15D can be formed in a suitably tapering configuration in accordance with the necessity, or in other words, each of the clock wiring lines 15A to 15D can be formed with a varying width.

Similarly, a pair of shield wiring lines 20 are formed on the opposite sides of each of the clock wiring lines 17A to 17D which interconnect the second buffers 13A to 13D and the third buffers 14A-1, 14A-2, 14B-3, 14B-4, 14C-1 to 14C-4 and 14D-1 to 14D-4, respectively. Consequently, each of the clock wiring lines 17A to 17D can be formed in a tapering configuration in accordance with the necessity, or in other words, each of the clock wiring lines 17A to 17D can be formed with a varying width.

In the clock distribution circuit of the present embodiment having the construction described above, the first buffer 12 is disposed at the central location of the chip 10, and a clock signal is supplied from the first buffer 12 to the second buffers 13A to 13D at the central locations of the four sides of the peripheral area of the chip 10 over the clock wiring lines 15A to 15D, respectively.

The chip peripheral area is normally used as an arrangement area (pad area) for I/O pads (not shown), and the second buffers 13A to 13D are formed making use of the pad area. Since a macro block or a like element is not disposed in the pad area at all, the second buffers 13A to 13D can be disposed at the central locations of the individual sides with any trouble.

Accordingly, if the first buffer 12 can be arranged at the central location of the chip 10, then the lengths of the clock wiring lines 15A to 15D from the first buffer 12 to the second buffers 13A to 13D become equal to each other, and consequently, the clock skews to the second buffers 13A to 13D can be made uniform.

Further, even if the first buffer 12 cannot be disposed at the central location of the chip 10 but is disposed at a somewhat displaced location, clock delays arising from such displacement are absorbed by the last stage connection wiring line system (linear wiring lines 16-1 to 16-4 and clock terminal connection wiring line) by which all of the outputs of the third buffers 14A-1, 14A-2, 14B-3, 14B-4, 14C-1 to 14C-4 and 14D-1 to 14D-4 and the clock terminals are wired ORed. Further, in the present embodiment, the clock delays can be positively absorbed by the dummy loads 31 and/or the tapering configurations of the clock wiring lines 15A to 15D and 17A to 17D.

Further, in the belt-like regions 10-1 to 10-4, the third buffers 14A-1, 14A-2, 14B-3, 14B-4, 14C-1 to 14C-4 and 14D-1 to 14D-4 are arranged in a juxtaposed relationship on linear lines and the outputs of them are connected to each other by the linear wiring lines 16-1 to 16-4, respectively.

Due to the construction described, the positions of the third buffers 14A-1, 14A-2, 14B-3 and 14B-4 disposed in the internal area of the chip can be translated readily along the linear wiring lines 16-1 to 16-4 in the belt-like regions 10-1 to 10-4, respectively, so that they may be suitably positioned readily in accordance with the arrangement condition of the macro blocks 21 to 29 in the chip 10.

Clock delays arising from displacements by the translational movements can be absorbed by the last stage connection wiring line system (linear wiring lines 16-1 to 16-4 and clock terminal connection wiring lines) by which all of the outputs of the third buffers 14A-1, 14A-2, 14B-3, 14B-4, 14C-1 to 14C-4 and 14D-1 to 14D-4 and the clock terminals are wired ORed as described above. Besides, in the present embodiment, the clock delays can be positively absorbed by the dummy loads 31 and/or the tapering arrangements of the clock wiring lines 15A to 15D and 17A to 17D.

Further, in the present embodiment, since the lengths of the clock wiring lines 17A to 17D from the second buffers 13A to 13D to the third buffers 14A-1, 14A-2, 14B-3, 14B-4, 14C-1 to 14C-4 and 14D-1 to 14D-4, respectively, can be made substantially uniform, the clock skews at the third buffers 14A-1, 14A-2, 14B-3, 14B-4, 14C-1 to 14C-4 and 14D-1 to 14D-4 can be made uniform.

Subsequently, adjustment in clock skew with a dummy load or loads 31 is described.

In a condition wherein a dummy load or loads 31 for load adjustment are connected to each of the clock wiring lines of the output sides of the second buffers 13A to 13D and the third buffers 14A-1, 14A-2, 14B-3, 14B-4, 14C-1 to 14C-4 and 14D-1 to 14D-4, the buffer has a high load and exhibits a low driving capacity. On the contrary, where no dummy load 31 for load adjustment is connected to each of the clock wiring lines on the output sides of the buffers (or the number of the dummy loads 31 connected is reduced), then the buffer has a reduced load and exhibits an increased driving capacity.

Accordingly, by adjusting the number of dummy loads 31 connected to the clock wiring line on the output side of each buffer by connecting a dummy load or loads 31 to the clock wiring line or cutting the metal wiring line between the clock wiring line and such dummy load or load 31, each of the loads (driving capacities) of the second buffers 13A to 13D and the third buffers 14A-1, 14A-2, 14B-3, 14B-4, 14C-1 to 14C-4 and 14D-1 to 14D-4 can be adjusted. Consequently, the clock delays (clock skews) can be adjusted positively.

Thus, in the last stage of designing of the clock distribution system, simulation is performed to detect clock skews at the outputs of the pertaining points (second buffers 13A to 13D, and third buffers 14A-1, 14A-2, 14B-3, 14B-4, 14C-1 to 14C-4 and 14D-1 to 14D-4). Then, by selectively connecting or disconnecting the dummy loads 31 in directions in which the distribution in clock skew becomes uniform, the clock skews can be made uniform with a higher degree of certainty, and consequently, a buffer arrangement which exhibits minimized skews can be achieved very readily.

Figure 3:
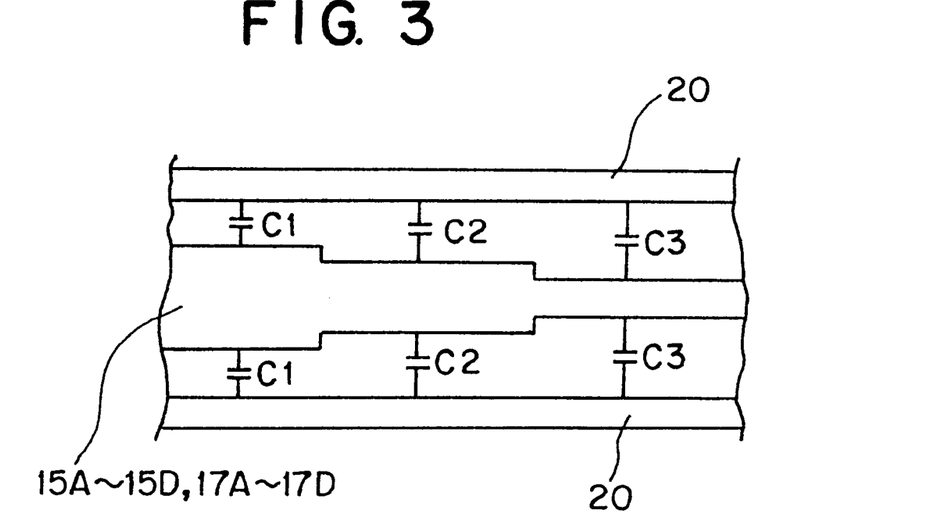
FIG. 3 is a diagrammatic view illustrating shield wiring lines and tapering employed in the clock distribution circuit shown in FIG. 1.

In the following, a tapering configuration of the shield wiring lines 20 and the clock wiring lines in the present embodiment is described.

In the clock distribution circuit of the present embodiment, a pair of shield wiring lines 20 are formed on the opposite sides of each of the clock wiring lines 15A to 15D and 17A to 17D in such a manner as seen in FIG. 3 so that the wiring line capacitance of any of the clock wiring lines 15A to 15D and 17A to 17D can be prevented from being varied by an influence of the other signal lines. Accordingly, the designer can always grasp the capacitance, can effect calculation taking the capacitance into consideration in an initial stage of designing and can make the clock skews uniform with a higher degree of certainty.

By the way, while the width of a clock wiring line usually is uniform from a certain buffer to another butter in the next stage, by forming each of the clock wiring lines 15A to 15D and 17A to 17D positioned between a pair of shield wiring lines 20 such that it has a varying width as seen in FIG. 3, the capacitances between each of the clock wiring lines 15A to 15D and 17A to 17D and the shield wiring lines 20 can be adjusted.

For example, if each of the clock wiring lines 15A to 15D and 17A to 17D is formed such that it has a width which decreases in three stages toward an end thereof as seen in FIG. 3, then the capacitances C1, C2 and C3 with the individual widths gradually decrease toward the end of the clock wiring line (C1>C2>C3). By adjusting the capacitances in this manner, the loads to (driving capacities of) the first buffer 12 and the second buffers 13A to 13D can be adjusted positively. Accordingly, by forming each of the clock wiring lines 15A to 15D and 17A to 17D in a tapering configuration, the clock skews can be made uniform with a higher degree of certainty, and a buffer arrangement which provides low skews can be realized very readily.

In a chip of the building block type, since normally a large number of huge macro blocks are present in the inside thereof, clock buffers to be arranged in the inside of the chip cannot be arranged freely.

In the clock distribution circuit of the embodiment of the present invention, those elements which are restricted by the arrangement of the macro blocks 21 to 29 are the third buffers 14A-1, 14A-2, 14B-3 and 14B-4 which are disposed in the internal region of the chip.

The third buffers 14A-1, 14A-2, 14B-3 and 14B-4 just mentioned are translatable in position as described above, and possible clock delays caused by such translational movement can be absorbed with certainty by adjustment of the last stage linear wiring lines 16-1 to 16-4 and 18 or the dummy loads 31 or by adjustment in width of the clock wiring lines 15A to 15D and 17A to 17D. In short, in the clock distribution circuit of the present embodiment, even if the wiring line lengths of the clock wiring lines 15A to 15D and 17A to 17D are not made uniform, the clock skews can be made uniform by adjustment of the last stage linear wiring lines 16-1 to 16-4 and 18 or the dummy loads 31 or by adjustment in width of the clock wiring lines 15A to 15D and 17A to 17D.

Accordingly, in designing the chip 10 of the building block type which includes a RAM or a large number of other huge macro blocks, the designer is not annoyed by the problem of insertion of buffers which arises from the arrangement positions of the blocks 21 to 29 on the chip 10. Further, a countermeasure can be taken against a requirement for modification in shape or movement of the macro blocks 21 to 29 which arises during designing, and a buffer arrangement which exhibits low skews can be realized readily.

It is to be noted that the present invention is not limited to the specific embodiment described above, but can be worked in various forms without departing from the spirit or scope of the present invention.

For example, while, in the embodiment described above, the chip 10 is partitioned into four belt-like regions, in each of which four third buffers are arranged, the present invention is not limited to the specific values.

Further, while, in the embodiment described above, each four third buffers are driven by one second buffer, the present invention is not limited to the specific arrangement.

Furthermore, the number of buffers which are driven by one buffer may be different among different buffers. In this instance, for example, if a certain buffer drives a number of buffers twice that of another buffer, the driving capacity of the certain buffer should be set to twice that of the another buffer.

In the meantime, while, in the embodiment described above, each clock wiring line has two dummy loads (dummy gates) 31 provided therefor, the present invention is not limited to the specific construction, and each clock wiring line may have an individually suitable number of dummy loads 31 as described hereinabove.

Further, while, in the embodiment described above, the first buffer 12 and the four second buffers 13A to 13D are connected to each other by the clock wiring lines 15A to 15D, respectively, in a one-by-one corresponding relationship to each other, a ring-shaped clock wiring line which interconnects the second buffers 13A to 13D may be provided in place of the clock wiring lines 15A to 15D in the chip peripheral area. The ring-shaped clock wiring line can make the clock skews at the second buffers 13A to 13D uniform.

What is claimed is:

1. A clock distribution circuit for a semiconductor integrated circuit wherein a plurality number of cells are disposed on a rectangular chip having four sides including two first parallel sides and two second parallel sides perpendicular to said first parallel sides for distributing a clock signal to those of said cells each of which has a clock terminal, comprising:

an input driver for receiving an external clock signal;

a first buffer disposed at a central location of said chip for receiving an output of said input driver;

four second buffers individually disposed at central locations of said four sides in a peripheral area of said chip for receiving an output of said first buffer;

a plurality of third buffers for receiving outputs of said second buffers;

a connection wiring line system for connecting all of outputs of said third buffers commonly to extract another clock signal to be supplied to said clock terminals;

said third buffers being disposed on linear lines parallel to said first sides of said chip while the outputs of said third buffers are connected to each other by linear wiring lines which form part of said last stage connection wiring line system and extend along the linear lines; and a load adjustment structure for adjusting a load to said first buffer or/and each of said second buffers.

2. A clock distribution circuit for a semiconductor integrated circuit as claimed in claim 1, wherein said chip is partitioned into a plurality of belt-like regions which extend in parallel to said first sides and in which said third buffers are individually disposed on the linear lines parallel to said first sides.

3. A clock distribution circuit for a semiconductor integrated circuit wherein a plurality number of cells are disposed on a rectangular chip having four sides including two first parallel sides and two second parallel sides perpendicular to said first parallel sides for distributing a clock signal to those of said cells each of which has a clock terminal, comprising:

an input driver for receiving an external clock signal;

a first buffer disposed at a central location of said chip for receiving an output of said input driver;

four second buffers individually disposed at central locations of said four sides in a peripheral area of said chip for receiving an output of said first buffer;

a plurality of third buffers for receiving outputs of said second buffers; and a connection wiring line system for connecting all of outputs of said third buffers commonly to extract another clock signal to be supplied to said clock terminals; and wherein said chip is partitioned into a plurality of belt-like regions which extend in parallel to said first sides and in each of which the third buffers are disposed on a linear line parallel to said first sides of said chip while the outputs of the third buffers are connected to each other by a linear wiring line which forms part of said last stage connection wiring line system and extends along the linear lines.

4. A clock distribution circuit for a semiconductor integrated circuit as claimed in claim 3, further comprising a load adjustment structure for adjusting a load to said first buffer or/and each of said second buffers.

5. A clock distribution circuit for a semiconductor integrated circuit as claimed in claim 2, wherein said last stage connection wiring line system is formed by connecting a clock terminal connection wiring line, which is formed in a wiring line layer different from a wiring line layer to which said linear wiring lines belong such that said clock terminal connection wiring line connects all clock terminals in said chip to each other, and said linear wiring lines to each other at intersecting points therebetween.

6. A clock distribution circuit for a semiconductor integrated circuit as claimed in claim 3, wherein said last stage connection wiring line system is formed by connecting a clock terminal connection wiring line, which is formed in a wiring line layer different from a wiring line layer to which the linear wiring lines belong such that said clock terminal connection wiring line connects all clock terminals in said chip to each other, and said linear wiring lines to each other at intersecting points therebetween.

7. A clock distribution circuit for a semiconductor integrated circuit as claimed in claim 4, wherein said last stage connection wiring line system is formed by connecting a clock terminal connection wiring line, which is formed in a wiring line layer different from a wiring line layer to which the linear wiring lines belong such that said clock terminal connection wiring line connects all clock terminals in said chip to each other, and said linear wiring lines to each other at intersecting points therebetween.

8. A clock distribution circuit for a semiconductor integrated circuit as claimed in claim 2, wherein:

said third buffers are disposed in said belt-like regions such that one of said third buffers is disposed on each of the second sides in the peripheral area of said chip and a plurality of ones of said third buffers are disposed in an internal region of said chip;

those of said second buffers which are arranged at the central locations of said second sides are connected to those of said third buffers which are disposed individually on said second sides; and those of said second buffers which are disposed at the central locations of said first sides are connected to those of said third buffers which are disposed in those halves of said internal region adjacent said first sides of said chip.

9. A clock distribution circuit for a semiconductor integrated circuit as claimed in claim 3, wherein:

said third buffers are disposed in said belt-like regions such that one of said third buffers is disposed on each of the second sides in the peripheral area of said chip and a plurality of ones of said third buffers are disposed in an internal region of said chip;

those of said second buffers which are arranged at the central locations of said second sides are connected to those of said third buffers which are disposed individually on said second sides; and those of said second buffers which are disposed at the central locations of said first sides are connected to those of said third buffers which are disposed in those halves of said internal region adjacent said first sides of said chip.

10. A clock distribution circuit for a semiconductor integrated circuit as claimed in claim 4, wherein:

said third buffers are disposed in said belt-like regions such that one of said third buffers is disposed on each of the second sides in the peripheral area of said chip and a plurality of ones of said third buffers are disposed in an internal region of said chip;

those of said second buffers which are arranged at the central locations of said second sides are connected to those of said third buffers which are disposed individually on said second sides; and those of said second buffers which are disposed at the central locations of said first sides are connected to those of said third buffers which are disposed in those halves of said internal region adjacent said first sides of said chip.

11. A clock distribution circuit for a semiconductor integrated circuit as claimed in claim 5, wherein:

said third buffers are disposed in said belt-like regions such that one of said third buffers is disposed on each of the second sides in the peripheral area of said chip and a plurality of ones of said third buffers are disposed in an internal region of said chip;

those of said second buffers which are arranged at the central locations of said second sides are connected to those of said third buffers which are disposed individually on said second sides; and those of said second buffers which are disposed at the central locations of said first sides are connected to those of said third buffers which are disposed in those halves of said internal region adjacent said first sides of said chip.

12. A clock distribution circuit for a semiconductor integrated circuit as claimed in claim 6, wherein:

said third buffers are disposed in said belt-like regions such that one of said third buffers is disposed on each of the second sides in the peripheral area of said chip and a plurality of ones of said third buffers are disposed in an internal region of said chip;

those of said second buffers which are arranged at the central locations of said second sides are connected to those of said third buffers which are disposed individually on said second sides; and those of said second buffers which are disposed at the central locations of said first sides are connected to those of said third buffers which are disposed in those halves of said internal region adjacent said first sides of said chip.

13. A clock distribution circuit for a semiconductor integrated circuit as claimed in claim 7, wherein:

said third buffers are disposed in said belt-like regions such that one of said third buffers is disposed on each of the second sides in the peripheral area of said chip and a plurality of ones of said third buffers are disposed in an internal region of said chip;

those of said second buffers which are arranged at the central locations of said second sides are connected to those of said third buffers which are disposed individually on said second sides; and those of said second buffers which are disposed at the central locations of said first sides are connected to those of said third buffers which are disposed in those halves of said internal region adjacent said first sides of said chip.

14. A clock distribution circuit for a semiconductor integrated circuit as claimed in claim 1, wherein said load adjustment structure includes at least one dummy gate for load adjustment provided for a clock wiring line on an output side of each of said second buffers.

15. A clock distribution circuit for a semiconductor integrated circuit as claimed in claim 4, wherein said load adjustment structure includes at least one dummy gate for load adjustment provided for a clock wiring line on an output side of each of said second buffers.

16. A clock distribution circuit for a semiconductor integrated circuit as claimed in claim 1, wherein said load adjustment structure includes at least one dummy gate for load adjustment provided for a clock wiring line on an output side of each of said third buffers.

17. A clock distribution circuit for a semiconductor integrated circuit as claimed in claim 4, wherein said load adjustment structure includes at least one dummy gate for load adjustment provided for a clock wiring line on an output side of each of said third buffers.

18. A clock distribution circuit for a semiconductor integrated circuit as claimed in claim 1, wherein, in a wiring line layer of clock wiring lines which interconnect said first buffer and said second buffers, a pair of shield wiring lines are formed on the opposite sides of each of said clock wiring lines.

19. A clock distribution circuit for a semiconductor integrated circuit as claimed in claim 1, wherein, in a wiring line layer of clock wiring lines which interconnect said second buffers and said third buffers, a pair of shield wiring lines are formed on the opposite sides of each of said clock wiring lines.

20. A clock distribution circuit for a semiconductor integrated circuit as claimed in claim 1, wherein said load adjustment structure is formed by forming, in a wiring line layer to which clock wiring lines which interconnect said first buffer and said second buffers belong, a pair of shield wiring lines on the opposite sides of each of said clock wiring lines and forming each of said clock wiring lines in a tapering configuration.

21. A clock distribution circuit for a semiconductor integrated circuit as claimed in claim 4, wherein said load adjustment structure is formed by forming, in a wiring line layer to which clock wiring lines which interconnect said first buffer and said second buffers belong, a pair of shield wiring lines on the opposite sides of each of said clock wiring lines and forming each of said clock wiring lines in a tapering configuration.

22. A clock distribution circuit for a semiconductor integrated circuit as claimed in claim 1, wherein said load adjustment structure is formed by forming, in a wiring line layer to which clock wiring lines which interconnect said second buffers and said third buffers belong, a pair of shield wiring lines on the opposite sides of each of said clock wiring lines and forming each of said clock wiring lines in a tapering configuration.

23. A clock distribution circuit for a semiconductor integrated circuit as claimed in claim 4, wherein said load adjustment structure is formed by forming, in a wiring line layer to which clock wiring lines which interconnect said second buffers and said third buffers belong, a pair of shield wiring lines on the opposite sides of each of said clock wiring lines and forming each of said clock wiring lines in a tapering configuration.

* * * * *

UNITED STATES PATENT AND TRADEMARK OFFICE
CERTIFICATE OF CORRECTION

PATENT NO.: 6,043,704
DATED : March 28, 2000
INVENTOR(S): Akihiro YOSHITAKE

It is certified that error appears in the above-identified patent and that said Letters Patent is hereby corrected as shown below:

On the title page:

Item [73], change "Fujitsi" to --Fujitsu--.

Signed and Sealed this

Sixth Day of March, 2001

Attest:

NICHOLAS P. GODICI

Attesting Officer

Acting Director of the United States Patent and Trademark Office